United States Patent
Hoang et al.

(10) Patent No.: US 9,645,661 B2
(45) Date of Patent: May 9, 2017

(54) DISPLAY SUBSTRATE AND METHOD OF MANUFACTURING THE SAME

(71) Applicant: Samsung Display Co., LTD., Yongin, Gyeonggi-Do (KR)

(72) Inventors: Euk-Chae Hoang, Asan-si (KR); Dae-Il Kim, Cheonan-si (KR); Seung-Rae Kim, Cheonan-si (KR); Jin-Yool Kim, Seoul (KR); Hyoung-Joon Kim, Cheonan-si (KR); Se-Ryun Lee, Asan-si (KR); Seong-Mo Hwang, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 241 days.

(21) Appl. No.: 14/527,486

(22) Filed: Oct. 29, 2014

(65) Prior Publication Data
US 2015/0253915 A1 Sep. 10, 2015

(30) Foreign Application Priority Data
Mar. 10, 2014 (KR) .......................... 10-2014-0027696

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/046* (2013.01); *G06F 3/0418* (2013.01);
(Continued)

(58) Field of Classification Search
CPC ...... G06F 3/0412; G06F 3/0418; G06F 3/046; G06F 2203/04103; G06F 2203/04111;
(Continued)

(56) References Cited

U.S. PATENT DOCUMENTS

| 4,878,553 A | 11/1989 | Yamanami et al. |
| 7,755,616 B2 | 7/2010 | Jung et al. |

(Continued)

FOREIGN PATENT DOCUMENTS

| CN | WO 2013075540 A1 * | 5/2013 | ......... G02F 1/13338 |
| JP | 10-268255 A | 10/1998 | |

(Continued)

*Primary Examiner* — Amare Mengistu
*Assistant Examiner* — Stacy Khoo
(74) *Attorney, Agent, or Firm* — Innovation Counsel LLP

(57) ABSTRACT

A display substrate includes a substrate, a plurality of first sensing loops and second sensing loops, an insulating layer covering the first and second sensing loops, a plurality of bridges disposed on the insulating layer, a gate line disposed on the insulating layer, and a transistor connected to the gate line, the transistor being disposed on the insulating layer. The first sensing loops are arranged on the substrate in a first direction at a predetermined interval. The second sensing loops are arranged on the substrate in a second direction different from the first direction at a predetermined interval. The second sensing loops are electrically separated from the first sensing loops. Each of the second sensing loops includes passing regions at which the first sensing loops pass through. One side of each of the first sensing loops and one side of each of the second sensing loops are open.

15 Claims, 7 Drawing Sheets

(51) Int. Cl.
*H01L 27/12* (2006.01)
*G06F 3/046* (2006.01)

(52) U.S. Cl.
CPC ........ *H01L 27/124* (2013.01); *H01L 27/1259* (2013.01); *H01L 27/323* (2013.01); *G06F 2203/04103* (2013.01); *G06F 2203/04111* (2013.01)

(58) Field of Classification Search
CPC .. H01L 27/323; H01L 27/124; H01L 27/1259
USPC ................................ 345/173–179, 204–212; 178/18.01–18.09; 438/3
See application file for complete search history.

(56) References Cited

U.S. PATENT DOCUMENTS

| | | | |
|---|---|---|---|
| 2004/0041956 A1* | 3/2004 | Hwang | G02F 1/136286 349/43 |
| 2004/0189587 A1* | 9/2004 | Jung | G02F 1/13338 345/102 |
| 2008/0055268 A1 | 3/2008 | Yoo et al. | |
| 2010/0108409 A1 | 5/2010 | Tanaka et al. | |
| 2011/0032209 A1* | 2/2011 | Kim | G06F 3/044 345/174 |
| 2011/0228188 A1* | 9/2011 | Kim | G02F 1/13338 349/43 |
| 2014/0253473 A1* | 9/2014 | Kim | G06F 3/044 345/173 |
| 2014/0333582 A1* | 11/2014 | Huo | G02F 1/13338 345/174 |

FOREIGN PATENT DOCUMENTS

| | | |
|---|---|---|
| JP | 2010-002563 A | 1/2010 |
| KR | 10-2011-0097345 B1 | 2/2012 |
| KR | 10-2012-0037610 A | 4/2012 |
| KR | 10-2013-0011673 A | 1/2013 |
| KR | 10-2013-0016546 A | 2/2013 |
| KR | 10-2013-0020485 A | 2/2013 |

* cited by examiner

DISPLAY SUBSTRATE AND METHOD OF MANUFACTURING THE SAME

CROSS-REFERENCE TO RELATED APPLICATION

This application claims priority under 35 USC §119 to Korean Patent Application No. 10-2014-0027696 filed Mar. 10, 2014 in the Korean Intellectual Property Office (KIPO), the contents of which are incorporated by reference herein in its entirety.

BACKGROUND

1. Technical Field

The present disclosure generally relates to a display panel. More particularly, the present disclosure relates to a display substrate that is used in a display panel and a method of manufacturing the display substrate.

2. Description of the Related Art

A touch input device is widely used in display devices. The touch input device operates by a user touching the screen of the display device using a finger or a stylus pen. The touch input device can be generally classified into a resistive type touch input device, a capacitive type touch input device, an infrared detection type touch input device, or an electromagnetic induction type touch input device. The resistive type touch input device can detect a touch input based on a change in resistance when a pen presses the screen of the display device. The capacitive type touch input device can detect a touch input based on a change in capacitance induced by a conductive pen. The infrared detection type touch input device can detect a touch input based on infrared reflected by a pen. The electromagnetic induction type touch input device can detect a touch input based on an electromagnetic wave generated by a pen (whereby the pen is an electromagnetic inducing object). The electromagnetic induction type touch input device has an advantage in that it is capable of detecting a position of the pen without the pen directly contacting the screen of the display device.

SUMMARY

The present disclosure discloses a display substrate including an electromagnetic induction type touch input device, and a method of manufacturing the display substrate.

According to some example embodiments of the inventive concept, a display substrate includes a substrate, a plurality of first sensing loops, a plurality of second sensing loops, an insulating layer covering the first sensing loops and the second sensing loops, a plurality of bridges disposed on the insulating layer, a gate line disposed on the insulating layer, and a transistor connected to the gate line, the transistor being disposed on the insulating layer. The first sensing loops are arranged on the substrate in a first direction at a predetermined interval. One side of each of the first sensing loops is open. The second sensing loops are arranged on the substrate in a second direction different from the first direction at a predetermined interval. The second sensing loops are electrically separated from the first sensing loops. Each of the second sensing loops includes passing regions at which the first sensing loops pass through. One side of each of the second sensing loops is open. The bridges penetrate the insulating layer and are formed in contact with the second sensing loops. The bridges intersect with the first sensing loops.

In some example embodiments, the first and second sensing loops may be disposed on a same layer. The bridges may be disposed at the passing regions.

In some example embodiments, the gate line and the bridges may be disposed on another same layer.

In some example embodiments, the bridges and the gate line may include a same conductive material.

In some example embodiments, the first sensing loops may include first transmitting loops that generate a transmitting electromagnetic wave based on a transmitting current, and first receiving loops that generate a receiving current based on a receiving electromagnetic wave generated from an external electromagnetic inducing object. The second sensing loops may include second transmitting loops that generate the transmitting electromagnetic wave, and second receiving loops that receive the receiving electromagnetic wave.

In some example embodiments, the first and second transmitting loops may be disposed on a same first layer, the first and second receiving loops may be disposed on a same second layer, and the first layer may be different from the second layer.

In some example embodiments, the insulating layer may include a first insulating layer covering the first transmitting loops and the second transmitting loops, and a second insulating layer covering the first receiving loops and the second receiving loops. The bridges may include first bridges electrically connecting portions of each of the second transmitting loops to each other at the passing regions, and second bridges electrically connecting portions of each of the second receiving loops to each other at the passing regions.

In some example embodiments, the gate line and the first bridges may be disposed on a same third layer. The gate line and the first bridges may include a same conductive material.

According to some example embodiments of the inventive concept, a method of manufacturing a display substrate includes forming a first conductive layer on a substrate, patterning the first conductive layer to form a plurality of first sensing loops and a plurality of second sensing loops, forming an insulating layer to cover the first sensing loops and the second sensing loops, etching the insulating layer to form a plurality of holes exposing portions of each of the second sensing loops, forming a plurality of bridges in contact with the portions of each of the second sensing loops by filling the holes, forming a gate line on the insulating layer, and forming a transistor electrically connected to the gate line. The first sensing loops are arranged on the substrate in a first direction at a predetermined interval. The second sensing loops are arranged on the substrate in a second direction different from the first direction at a predetermined interval. The second sensing loops are electrically separated from the first sensing loops. Each of the second sensing loops includes passing regions at which the first sensing loops pass through. One side of each of the first sensing loops and one side of each of the second sensing loops are open.

In some example embodiments, the bridges may intersect with the first sensing loops at the passing regions.

In some example embodiments, the bridges and the gate line may be concurrently formed using a second conductive layer.

According to some example embodiments of the inventive concept, a display substrate includes a substrate, a plurality of first sensing loops, a plurality of second sensing loops, a gate line disposed on a same layer as the first sensing loops and the second sensing loops, an insulating layer covering the first sensing loops, the second sensing loops, and the gate line, a plurality of bridges disposed on the insulating layer, and a transistor electrically connected to the gate line. The first sensing loops are arranged on the substrate in a first direction at a predetermined interval. One side of each of the first sensing loops is open. The second sensing loops are arranged on the substrate in a second direction different from the first direction at a predetermined interval. The second sensing loops are electrically separated from the first sensing loops. Each of the second sensing loops includes passing regions at which the first sensing loops pass through. One side of each of the second sensing loops is open. The bridges intersect with the first sensing loops. The bridges penetrate the insulating layer and are formed in contact with the second sensing loops.

In some example embodiments, the first and second sensing loops may be disposed on the same layer. The bridges may be disposed at the passing regions.

In some example embodiments, the first and second sensing loops and the gate line may include a same conductive material.

In some example embodiments, the bridges and a source or a drain electrode of the transistor may be disposed on another same layer.

In some example embodiments, the bridges and a data line connected to the transistor may be disposed on another same layer.

A display substrate according to the above example embodiments may include an electromagnetic induction type touch input device formed having an in-cell structure. Accordingly, an additional board (or substrate) for disposing the electromagnetic induction type touch input device is not needed, and therefore the display panel including the exemplary display substrate can have a slim thickness. Since a distance between an external electromagnetic inducing object and the sensing loops may be reduced, a position of the external electromagnetic inducing object may be detected with high sensitivity. Also, since the bridges connecting the second sensing loops to each other are formed using a low resistance conductive material (same as the material used in a gate line), a resistance of the sensing loops may be reduced.

Further, a method of manufacturing a display substrate according to the example embodiments simplifies the manufacturing process for a display substrate including an electromagnetic induction type touch input device having an in-cell structure.

BRIEF DESCRIPTION OF THE DRAWINGS

The inventive concept is herein described in detail with reference to the accompanying drawings.

DETAILED DESCRIPTION

Figure 1:
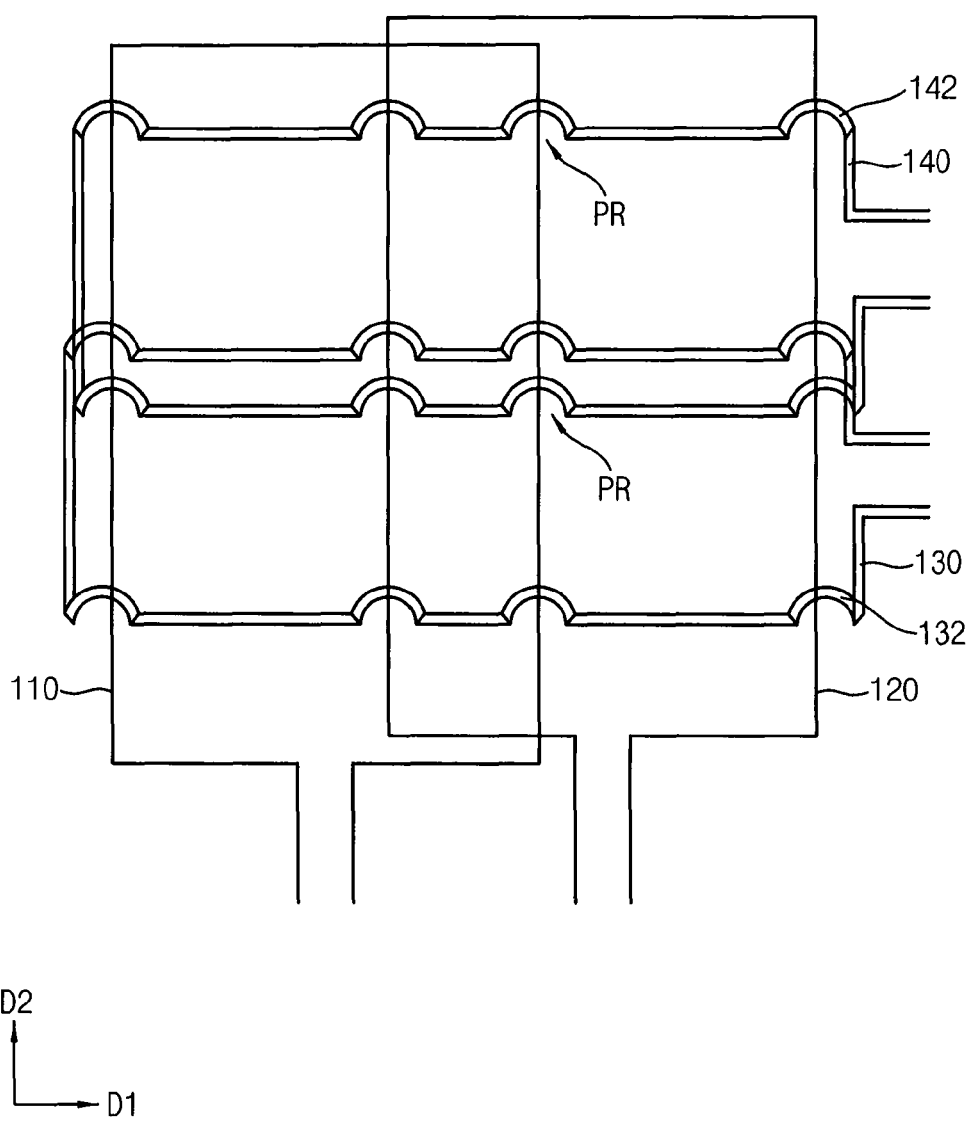
FIG. 1 is a plan view of a display substrate according to an example embodiment.

Various example embodiments will be described more fully herein with reference to the accompanying drawings, in which some example embodiments are shown. The present inventive concept may, however, be embodied in many different forms and should not be construed as being limited to the example embodiments set forth herein. Rather, these example embodiments are provided so that this disclosure will be thorough and complete, and fully convey the scope of the present inventive concept to those skilled in the art. In the drawings, the sizes and relative sizes of layers and regions may be exaggerated for clarity. Like numerals refer to like elements throughout.

It will be understood that, although the terms "first," "second," "third," etc. may be used herein to describe various elements, these elements should not be limited by those terms. Rather, those terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element, or with one or more intervening elements being present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to limit the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
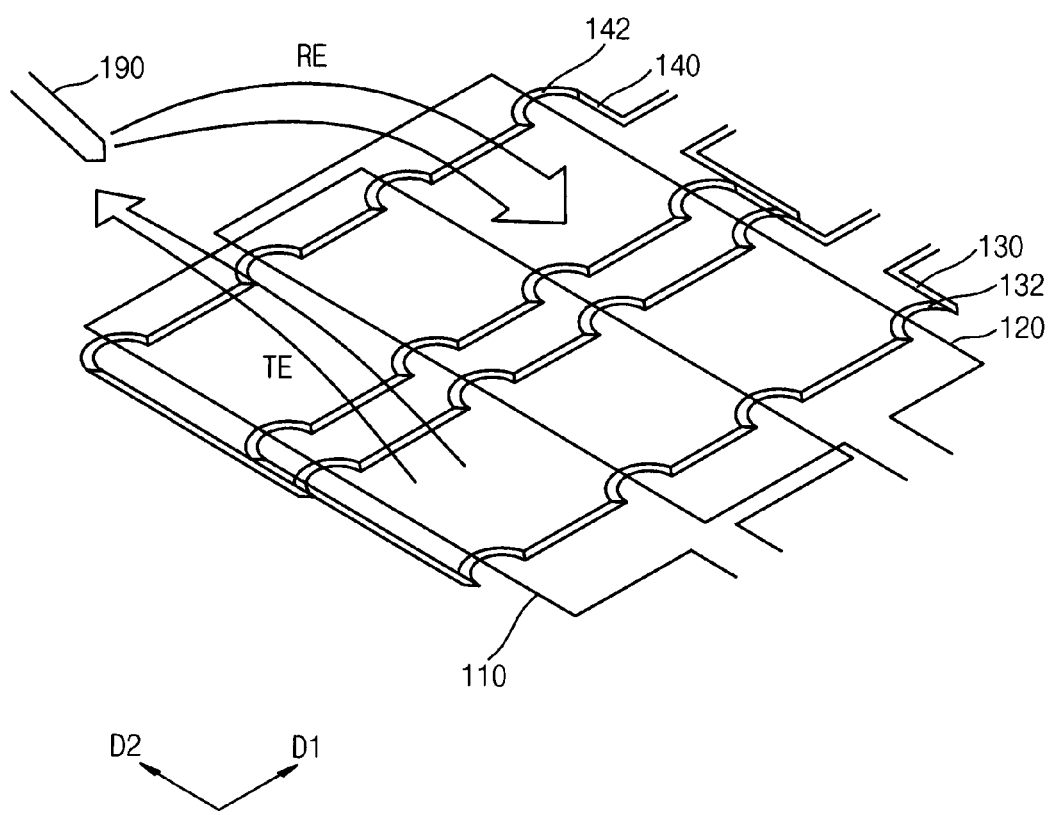
FIG. 2 is a diagram illustrating a principle of operation of the sensing loops in the display substrate of FIG. 1.
Figure 3:
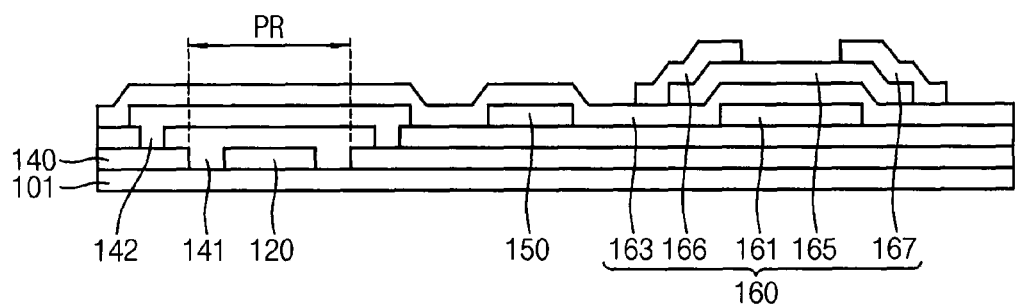
FIG. 3 is a cross-sectional view of the display substrate of FIG. 1.

FIG. 1 is a plan view of a display substrate according to an example embodiment. FIG. 2 is a diagram illustrating a principle of operation of the sensing loops in the display substrate of FIG. 1. FIG. 3 is a cross-sectional view of the display substrate of FIG. 1.

Referring to FIGS. 1 through 3, a display substrate 100 may include a substrate 101, first sensing loops 110 and 120, second sensing loops 130 and 140, an insulating layer 141, bridges 132 and 142, a gate line 150, and a transistor 160.

The display substrate 100 may be a substrate that is used in a display panel. For example, the display substrate 100 may be used in a liquid crystal display panel or an organic light emitting display panel. In an example embodiment in which the display substrate 100 is used in an organic light emitting display panel, an organic light emitting diode connected to the transistor 160 may be disposed on the display substrate 100. In another example embodiment in which the display substrate 100 is used in a liquid crystal display panel, a liquid crystal may be disposed on the display substrate 100.

The substrate 101 may support the first sensing loops 110 and 120, the second sensing loops 130 and 140, the gate line 150, and the transistor 160. The substrate 101 may be a glass substrate or a plastic substrate (for physical toughness and chemical stability). If the substrate 101 is a glass substrate, the substrate 101 may include silicon oxide (SiOx). If the substrate 101 is a plastic substrate, the substrate 101 may include polyacrylate (PAR), polyetherimide (PEI), polyethylene terephthalate (PET), polyethylene naphthalate (PEN), polyphenylene sulfide (PPS), Polyimide, polycarbonate (PC), etc.

The transistor 160 may be disposed on the substrate 101 and may be electrically connected to a pixel element. The transistor 160 may serve as a switching element for transmitting an electric signal to the pixel element. In an example embodiment, the transistor 160 may include a gate electrode 161, a gate insulation layer 163 covering the gate electrode 161, a semiconductor layer 165 overlapping the gate electrode 161 and disposed on the gate insulation layer 163, and a source electrode 166 and a drain electrode 167 disposed in contact with the semiconductor layer 165. The gate electrode 161 may form a channel at the semiconductor layer 165, and is configured to turn-on or turn-off the transistor 160 based on a gate voltage. The gate electrode 161 may include a metal, a conductive metal nitride, a conductive metal oxide, a transparent conductive material, etc. The gate insulation layer 163 may cover the gate electrode 161 so as to insulate the gate electrode 161 from the semiconductor layer 165. The gate insulation layer 163 may include an oxide, an organic insulating material, etc. The semiconductor layer 165 may be disposed on the gate insulation layer 163 and overlap with the gate electrode 161. When the gate voltage is applied to the gate electrode 161, the channel is formed in the semiconductor layer 165 and an electric signal may be transmitted from the source electrode 166 to the drain electrode 167. The semiconductor layer 165 may include polysilicon, polysilicon having an impurity, an amorphous silicon, an amorphous silicon having an impurity, an oxide silicon, an oxide silicon having an impurity, etc. The source electrode 166 and the drain electrode 167 may be electrically connected to the semiconductor layer 165. For example, the source electrode 166 and the drain electrode 167 may be disposed in contact with both sides of the semiconductor layer 165. Each of the source electrode 166 and the drain electrode 167 may include a metal, a conductive metal nitride, a conductive metal oxide, a transparent conductive material, etc.

The gate line 150 may be electrically connected to the transistor 160. For example, the gate line 150 may be electrically connected to the gate electrode 161 of the transistor 160. The transistor 160 may be turned on or turned off based on the gate signal transmitted from the gate line 150. The gate line 150 may include a metal, a conductive metal nitride, a conductive metal oxide, a transparent conductive material, or any material that has a low resistance.

The sensing loops 110, 120, 130, and 140 may be disposed on the substrate 101, and may be configured to detect an electromagnetic wave. The electromagnetic wave may be generated from an external electromagnetic inducing object (e.g., a stylus pen) 190. The sensing loops 110, 120, 130, and 140 may be used in an electromagnetic induction touch input device, so as to allow the device to detect a touch input from a pen based on the generated electromagnetic wave. In an example embodiment, the sensing loops 110, 120, 130, and 140 may include the first sensing loops 110 and 120 and the second sensing loops 130 and 140. The first sensing loops 110 and 120 may be arranged in a first direction D1 at a predetermined interval, and one side of each of the first sensing loops 110 and 120 may be open. The second sensing loops 130 and 140 may be arranged in a second direction D2 at a predetermined interval, and one side of each of the second sensing loops 130 and 140 may be open. The second direction D2 and the first direction D1 may extend in different directions, so that the first sensing loops 110 and 120 and the second sensing loops 130 and 140 may intersect. For example, the first sensing loops 110 and 120 may be arranged in a horizontal direction (e.g., x-axis direction) at a predetermined interval. The second sensing loops 130 and 140 may be arranged in a vertical direction (e.g., y-axis direction) at a predetermined interval. A position of the external electromagnetic inducing object 190 may be measured in minute segments by the first sensing loops 110 and 120 and the second sensing loops 130 and 140.

In an example embodiment, one side of each of the first sensing loops 110 and 120, and one side of each of the second sensing loops 130 and 140, may be open. The open sides of the sensing loops may be connected to a sensing determination unit. The sensing determination unit may be configured to receive an electric signal from the sensing loops 110, 120, 130, and 140. The sensing determination unit may determine the position of the external electromagnetic inducing object 190 based on the electric signal. For example, the electric signal may be a receiving current induced by a receiving electromagnetic wave. The sensing determination unit may be disposed on the display substrate 100 or an external substrate.

The first sensing loops 110 and 120 and the second sensing loops 130 and 140 may be disposed on the same layer. Referring to FIG. 3, the first sensing loops 110 and 120 may be disposed on the substrate 101, and the second sensing loops 130 and 140 may be disposed on the same layer as the first sensing loops 110 and 120. The second sensing loops 130 and 140 are electrically separated from the first sensing loops 110 and 120. Since the first sensing loops 110 and 120 may be arranged in a direction different from that of the second sensing loops 130 and 140, the first sensing loops 110 and 120 may intersect with the second sensing loops 130 and 140. In an example embodiment, since the second sensing loops 130 and 140 are electrically separated from the first sensing loops 110 and 120, each of the second sensing loops 130 and 140 may include separation regions at which the first sensing loops 110 and 120 pass through the second sensing loops 130 and 140. Since the first sensing loops 110 and 120 pass through the second sensing loops 130 and 140 at the separation regions, the separation regions will be herein defined as passing regions PR. Each of the second sensing loops 130 and 140 may be electrically terminated at the passing regions PR, in order to be electrically separated from the first sensing loops 110 and 120. In another example embodiment, each of the first sensing loops 110 and 120 may include passing regions PR at which the second sensing loops 130 and 140 pass through the first sensing loops 110 and 120. Each of the first sensing loops 110 and 120 may be electrically terminated at the passing regions PR, in order to be electrically separated from the second sensing loops 130 and 140. The first sensing loops 110 and 120 and the second sensing loops 130 and 140 may include a conductive material. As described above, since the sensing loops 110, 120, 130, and 140 generate an electromagnetic wave based on a current, or generate an induced current based on the electromagnetic wave, the sensing loops 110, 120, 130, and 140 may include a metal, a conductive metal oxide, a conductive metal nitride, a transparent conductive material, etc, in which a current can easily flow. For example, the sensing loops 110, 120, 130, and 140 may include a metal (e.g., aluminum (Al), silver (Ag), gold (Au), platinum (Pt), chromium (Cr), tungsten (W), molybdenum (Mo), titanium (Ti), palladium (Pd) or an alloy thereof), a transparent conductive material (e.g., indium tin oxide (ITO), indium zinc oxide (IZO), aluminum zinc oxide (AZO), tin oxide (SnOx), indium oxide (InOx), gallium oxide (GaOx), etc), etc. The above-listed materials may be used alone or in combination in the sensing loops 110, 120, 130, and 140. The sensing loops 110, 120, 130, and 140 may be formed as a single layered structure or a multi-layered structure including one or more of the above-listed materials.

The insulation layer 141 may be disposed covering the first sensing loops 110 and 120 and the second sensing loops 130 and 140. The insulation layer 141 may protect the first sensing loops 110 and 120 and the second sensing loops 130 and 140 from external dust. The insulation layer 141 may also insulate the first sensing loops 110 and 120 from the second sensing loops 130 and 140. The insulation layer 141 may include silicon oxide (SiOx), hafnium oxide (HfOx), aluminum oxide (AlOx), zirconium oxide (ZrOx), titanium oxide (TiOx), tantalum oxide (TaOx), a benzocyclobutene (BCB)-based resin, an acryl-based resin, etc.

The bridges 132 and 142 may electrically connect the terminated portions of each of the sensing loops 110, 120, 130, and 140 to each other. As illustrated in FIG. 1, if portions of each of the second sensing loops 130 and 140 are terminated at the passing regions PR, the bridges 132 and 142 may connect the terminated portions of each of the second sensing loops 130 and 140 to each other. The bridges 132 and 142 may intersect with the first sensing loops 110 and 120 at the passing regions PR. The insulation layer 141 may be disposed between the bridges 132 and 142 and the first sensing loops 110 and 120. As described above, since the bridges 132 and 142 electrically connect the terminated portions of each of the second sensing loops 130 and 140 to each other at the passing regions PR, the second sensing loops 130 and 140 may be electrically separated from the first sensing loops 110 and 120, and will intersect with the first sensing loops 110 and 120. In an example embodiment, the bridges 132 and 142 may electrically connect the terminated portions of each of the second sensing loops 130 and 140 to each other (through direct contact with the second sensing loops 130 and 140). Specifically, the bridges 132 and 142 may penetrate the insulation layer 141 and contact with the terminated portions of each of the second sensing loops 130 and 140. In another example embodiment, the bridges 132 and 142 may be electrically connected to the terminated portions of each of the second sensing loops 130 and 140 via an additional contact unit or pad having a low contact resistance.

In an example embodiment, the bridges 132 and 142 may be disposed on the same layer as that of the gate line 150. The insulation layer 141 may also be disposed under the gate line 150 so as to support the gate line 150, and the sensing loops 110, 120, 130, and 140 may be disposed under the insulation layer 141. Thus, an electromagnetic induction type touch input device may be formed on the display substrate 100 having an in-cell structure.

In contrast, a conventional electromagnetic induction type touch input device may need to be formed on an additional board or film, and the additional board or film may need to be bonded to an upper surface or a lower surface of the display panel. For example, in a liquid crystal display panel, the additional board or film including the electromagnetic induction type touch input device may be bonded to a lower surface of a backlight unit. As a result, a thickness of the display panel having a conventional electromagnetic induction type touch input device may be increased, and a distance between the external electromagnetic inducing object and the electromagnetic induction type touch input device may be also increased, thereby causing a sensitivity of the conventional electromagnetic induction type touch input device to deteriorate.

However, according to the inventive concept, the sensing loops 110, 120, 130, and 140 are disposed on the display substrate 100, which eliminates the need for an additional board or film for the electromagnetic induction type touch input device. As a result, the thickness of the display panel including the exemplary substrate 100 may be reduced. Further, since the distance between the external electromagnetic inducing object 190 and the exemplary electromagnetic induction type touch input device is reduced, the sensitivity of the exemplary electromagnetic induction type touch input device may be improved. If the bridges 132 and 142 are formed on the same layer as that of the gate line 150, the bridges 132 and 142 may also include the same material as that of the gate line 150. For example, the bridges 132 and 142 may include a metal, a conductive metal oxide, and/or an alloy of metals that have low resistance. For example, the bridges 132 and 142 may include a low resistance metal (e.g., copper, aluminum, silver, gold, tungsten, etc).

As described above, the bridges 132 and 142 of the display substrate 100 may penetrate the insulation layer 141 and electrically connect the terminated portions of each of the second sensing loops 130 and 140, so that the second sensing loops 130 and 140 may intersect with the first sensing loops 110 and 120, and be electrically separated from the first sensing loops 110 and 120. Since the first sensing loops 110 and 120 may intersect with the second sensing loops 130 and 140, a position of the external electromagnetic inducing object 190 can thus be detected with high sensitivity. In an example embodiment, each of the first sensing loops 110 and 120, and each of the second sensing loops 130 and 140 may include a plurality of sub loops. For example, the first sensing loops 110 and 120 may include first transmitting loops 110 configured to generate a transmitting electromagnetic wave TE based on a transmitting current, and first receiving loops 120 configured to generate a receiving current based on a receiving electromagnetic wave RE. The second sensing loops 130 and 140 may include second transmitting loops 130 configured to generate the transmitting electromagnetic wave TE based on the transmitting current, and second receiving loops 140 configured to generate the receiving current based on the receiving electromagnetic wave RE. Referring to FIGS. 1 through 3, the sensing loops may include one transmitting loop 110 and one transmitting loop 130, and one receiving loop 120 and one receiving loop 140. In another embodiment, the sensing loops may include a plurality of transmitting loops 110 and 130, and a plurality of receiving loops 120 and 140. The first transmitting loops 110 and the second transmitting loops 130 may respectively generate the transmitting electromagnetic wave TE based on the transmitting current. A change of current induces the electromagnetic wave. When the transmitting current flows through the first transmitting loops 110 (or the second transmitting loops 130), the transmitting electromagnetic wave TE may be generated at the first transmitting loops 110 (or the second transmitting loops 130). For example, the transmitting current may be provided from the sensing determination unit connected to the open side of the first transmitting loops 110 and the open side of the second transmitting loops 130. The external electromagnetic inducing object 190 receiving the transmitting electromagnetic wave TE may generate the receiving electromagnetic wave RE. For example, the external electromagnetic inducing object 190 may respond to the transmitting electromagnetic wave TE having a specific frequency, and generate the receiving electromagnetic wave RE having a specific frequency. The first receiving loops 120 and the second receiving loops 140 may respectively generate the receiving current based on the receiving electromagnetic wave RE. A change of electromagnetic wave generates an induced current. When the receiving electromagnetic wave RE reaches the first receiving loops 120 (or the second receiving loops 140), the receiving current may be induced at the first receiving loops 120 (or the second receiving loops 140). For example, an induced receiving current may be transmitted to the sensing determination unit connected to the open side of the first receiving loops 120 and the open side of the second receiving loops 140.

A position of the external electromagnetic inducing object 190 may be detected by the receiving current induced by the receiving electromagnetic wave RE. Referring to FIG. 2, the transmitting loops 110 and 130 may generate the transmitting electromagnetic wave TE based on the transmitting current. If the external electromagnetic inducing object 190 is placed in proximity to the sensing loops 110, 120, 130, and 140, the external electromagnetic inducing object 190 may generate the receiving electromagnetic wave RE in response to the transmitting electromagnetic wave TE. The receiving electromagnetic wave RE may be received by a plurality of receiving loops 120 and 140 adjacent to the external electromagnetic inducing object 190. For example, the receiving loops 120 and 140 may be densely arranged at a predetermined interval. The receiving electromagnetic wave RE may be concurrently received by the plurality of receiving loops 120 and 140. The receiving loops 120 and 140 that receive the receiving electromagnetic wave RE may concurrently generate the receiving current. Since an intensity of the receiving current is proportional to an intensity of the receiving electromagnetic wave RE, the receiving current induced at the receiving loops 120 and 140 nearest to the external electromagnetic inducing object 190 may have the highest intensity. For example, if the external electromagnetic inducing object 190 is positioned next to or above an intersection region of the first receiving loop 120 and the second receiving loop 140, the receiving electromagnetic wave RE generated from the external electromagnetic inducing object 190 may be largely transmitted to the first receiving loop 120 from among the plurality of first sensing loops 110 and 120 arranged in the first direction D1. Further, the receiving electromagnetic wave RE may be largely transmitted to the second receiving loop 140 from among the plurality of second sensing loops 130 and 140 arranged in the second direction D2. In this case, the receiving current having the highest intensity may be generated at the first receiving loop 120 and the second receiving loop 140, so that the intensity of the receiving current induced at the first receiving loop 120 and the second receiving loop 140 may have the highest level. In an example embodiment, the receiving currents induced at the receiving loops 120 and 140 may be respectively transmitted to the sensing determination unit. The sensing determination unit may select the receiving current having the highest intensity level, and detect the position of the receiving loops 120 and 140 having the highest intensity level of the receiving current. For example, the sensing determination unit may detect a x-coordinate of the first receiving loop 120 from among a plurality of the receiving loops arranged in a x-axial direction, and a y-coordinate of the second receiving loop 140 from among a plurality of the receiving loops arranged in a y-axial direction, so that the sensing determination unit may detect a position of the external electromagnetic inducing object 190.

As described above, the sensing loops 110, 120, 130, and 140 for detecting a position of the external electromagnetic inducing object 190 may be formed in the display substrate 100 having an in-cell structure. In other words, the display substrate 100 may include an electromagnetic induction type touch input device having the in-cell structure. The in-cell structure eliminates the need to have an additional board or film for the electromagnetic induction type touch input device. Accordingly, a display panel including the display substrate 100 may have relatively slim thickness, and a manufacturing process for the display panel may be simplified. Further, since a distance between the external electromagnetic inducing object 190 and the sensing loops 110, 120, 130, and 140 is reduced, the sensitivity of the electromagnetic induction type touch input device may be improved. Furthermore, since the bridges 132 and 142 connecting the terminated portions of each of the second sensing loops 130 and 140 to each other are formed of a low resistance metal (that is of the same material as the gate line 150), a resistance of the sensing loops 130 and 140 may be reduced.

Figure 4:
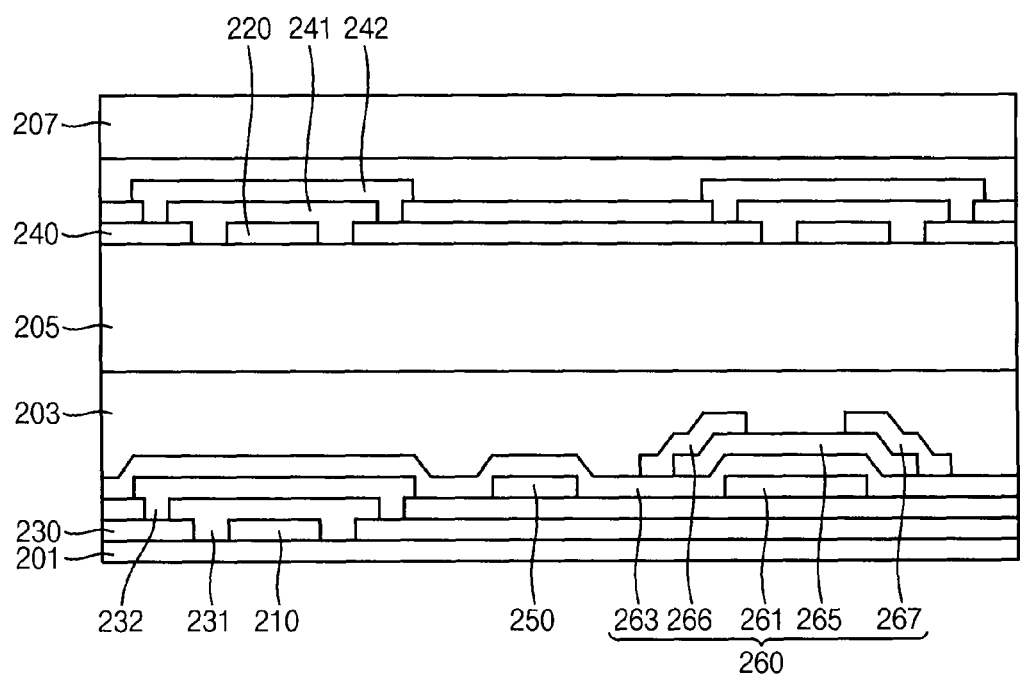
FIG. 4 is a cross-sectional view of a display substrate according to another example embodiment.

FIG. 4 is a cross-sectional view of a display substrate according to another example embodiment.

Referring to FIG. 4, a display substrate 200 may include a substrate 201, first sensing loops 210 and 220, second sensing loops 230 and 240, insulation layers 231 and 241, bridges 232 and 242, a gate line 250, and a transistor 260. Since the aforementioned elements of the display substrate 200 are similar to the corresponding elements described in FIGS. 1 to 3, a detailed description of those similar elements shall be omitted.

The sensing loops 210, 220, 230, and 240 may be disposed on the substrate 201, and may be configured to detect an electromagnetic wave. In an example embodiment, the sensing loops 210, 220, 230, and 240 may include first sensing loops 210 and 220 and second sensing loops 230 and 240. The first sensing loops 210 and 220 may be arranged in a first direction at a predetermined interval, and one side of each of the first sensing loops 210 and 220 may be open. The second sensing loops 230 and 240 may be arranged in a second direction at a predetermined interval, and one side of each of the second sensing loops 230 and 240 may be open. The first direction may be different from the second direction, so that the first sensing loops 210 and 220 and the second sensing loops 230 and 240 may intersect.

In an example embodiment, the first sensing loops 210 and 220 and the second sensing loops 230 and 240 may include a plurality of transmitting loops 210 and 230 and a plurality of receiving loops 220 and 240. For example, the first sensing loops 210 and 220 may include first transmitting loops 210 and first receiving loops 220. The second sensing loops 230 and 240 may include second transmitting loops 230 and second receiving loops 240. Each of the transmitting loops 210 and 230 may generate a transmitting electromagnetic wave based on a transmitting current, and each of the receiving loops 220 and 240 may generate a receiving current based on a receiving electromagnetic wave. Since the sensing functions and principles of the transmitting loops 210 and 230 and the receiving loops 220 and 240 have been previously described, a description of those sensing functions and principles will not be repeated.

In an example embodiment, some of the first sensing loops 210 and 220, and some of the second sensing loops 230 and 240, are disposed on the same layer. For example, as illustrated in FIG. 4, the first transmitting loops 210 and the second transmitting loops 230 may be disposed on the same layer, and the first receiving loops 220 and the second receiving loops 240 may be disposed on the same layer. When the display substrate 200 is used in a liquid crystal display panel, the first transmitting loops 210 and the second transmitting loops 230 may be disposed on the substrate 201, and the first receiving loops 220 and the second receiving loops 240 may be disposed on the liquid crystal layer 205. In this case, the transmitting loops 210 and 230 may be separated from the receiving loops 220 and 240, so that a position of an external electromagnetic inducing object may be accurately detected.

In an example embodiment, since the first sensing loops 210 and 220 are disposed in a direction different from that of the second sensing loops 230 and 240, the first sensing loops 210 and 220 may intersect with the second sensing loops 230 and 240. In an example embodiment, since the second sensing loops 230 and 240 are electrically separated from the first sensing loops 210 and 220, each of the second sensing loops 230 and 240 may include passing regions at which the first sensing loops 210 and 220 pass through the second sensing loops 230 and 240. Each of the second sensing loops 230 and 240 may be electrically terminated at the passing regions, so as to be electrically separated from the first sensing loops 210 and 220. In another example embodiment, each of the first sensing loops 210 and 220 may include passing regions at which the second sensing loops 230 and 240 pass through the first sensing loops 210 and 220. Each of the first sensing loops 210 and 220 may be electrically terminated at the passing regions, so as to be electrically separated from the second sensing loops 230 and 240.

In an example embodiment, the first sensing loops 210 and 220 and the second sensing loops 230 and 240 may include a conductive material. Since the sensing loops 210, 220, 230, and 240 generate an electromagnetic wave based on a current, or generate an induced current based on the electromagnetic wave, the sensing loops 210, 220, 230, and 240 may include a metal, a conductive metal oxide, a conductive metal nitride, a transparent conductive material, etc, in which a current can easily flow. Since the metal, the conductive metal oxide, the conductive metal nitride, or the transparent conductive material included in the sensing loops 210, 220, 230, and 240 have been previously described, a description of those materials will not be repeated.

In an example embodiment, one side of each of the first sensing loops 210 and 220, and one side of each of the second sensing loops 230 and 240 may be open. The open sides of the sensing loops may be connected to a sensing determination unit. The sensing determination unit may receive an electric signal from the sensing loops 210, 220, 230, and 240. The sensing determination unit may determine the position of the external electromagnetic inducing object based on the electric signal. For example, the electric signal may be a receiving current induced by a receiving electromagnetic wave. When the transmitting loops 210 and 230 are disposed on a layer different from that of the receiving loops 220 and 240, additional transmitting lines electrically connecting the transmitting loops 210 and 230 to the sensing determination unit may be formed. Further additional receiving lines electrically connecting the receiving loops 220 and 240 to the sensing determination unit may also be formed. The additional transmitting lines and receiving lines may be directly formed on the substrate 201, or formed on a flexible printed circuit board (FPCB) that is in electrically connected to the transmitting loops 210 and 230 and the receiving loops 220 and 240.

The insulation layer 231 and 241 may be disposed covering the first sensing loops 210 and 220 and the second sensing loops 230 and 240. For example, a first insulation layer 231 may be disposed on the substrate 201 covering the first transmitting loops 210 and the second transmitting loops 230. A second insulation layer 241 may be disposed on a liquid crystal layer 205 covering the first receiving loops 220 and the second receiving loops 240. The insulation layer 231 and 241 may protect the first sensing loops 210 and 220 and the second sensing loops 230 and 240 from external dust. The insulation layer 231 and 241 may also insulate the first sensing loops 210 and 220 from the second sensing loops 230 and 240. The insulation layer 231 and 241 may include an oxide, an organic insulating material, etc. For example, the insulation layer 231 and 241 may include a transparent oxide or a transparent organic insulating material that allows transmission of light emitted from a backlight unit or an organic light emitting diode.

The bridges 232 and 242 may electrically connect the terminated portions of each of the sensing loops 210, 220, 230, and 240 to each other. For example, the bridges 232 and 242 may include first bridges 232 connecting the terminated portions of each of the second transmitting loops 230 to each other, and second bridges 242 connecting the terminated portions of each of the second receiving loops 240 to each other. The first bridges 232 may intersect with the first transmitting loops 210, and the second bridges 242 may intersect with the first receiving loops 220. Since the bridges 232 and 242 electrically connect the terminated portions of each of the second sensing loops 230 and 240 to each other, the second sensing loops 230 and 240 may be electrically separated from the first sensing loops 210 and 220, and intersect with the first sensing loops 210 and 220. In an example embodiment, the bridges 232 and 242 may electrically connect the terminated portions of each of the second sensing loops 230 and 240 to each other through direct contact with the terminated portions of each of the second sensing loops 230 and 240. For example, the first bridges 232 may penetrate the first insulation layer 231 and contact the terminated portions of each of the second transmitting loops 230. The second bridges 242 may penetrate the second insulating layer 241 and contact the terminated portions of each of the second receiving loops 240. In another example embodiment, the bridges 232 and 242 may be electrically connected to the terminated portions of each of the second sensing loops 230 and 240 via an additional contact unit or pad having a low contact resistance.

In an example embodiment, the first bridges 232 may be disposed on the same layer as the gate line 250. In other words, the first insulation layer 231 supporting the gate line 250 may be disposed under the gate line 250, and the first transmitting loops 210 and the second transmitting loops 230 may be disposed under the first insulation layer 231. The first bridges 232 may include the same material as the gate line 250. For example, the first bridges 232 may include a metal, a conductive metal oxide, and/or an alloy of metals that have low resistance.

As described above, the sensing loops 210, 220, 230, and 240 for detecting a position of the external electromagnetic inducing object may be formed in the display substrate 200 having an in-cell structure. In other words, the display substrate 200 may include an electromagnetic induction type touch input device having the in-cell structure. The in-cell structure eliminates the need for an additional board or film for the electromagnetic induction type touch input device. Accordingly, a display panel including the display substrate 200 may have relatively slim thickness, and a manufacturing process for the display panel may be simplified. Further, since the transmitting loops 210 and 230 are disposed on the same layer, and the receiving loops 220 and 240 separated from the transmitting loops 210 and 230 are disposed on the same layer, the sensitivity of the electromagnetic induction type touch input device may be improved. Furthermore, since the first bridges 232 connecting the terminated portions of each of the second transmitting loops 230 to each other are formed with a low resistance metal (the same material as that of the gate line 250), a resistance of the second transmitting loops 230 may be reduced.

Figure 5:
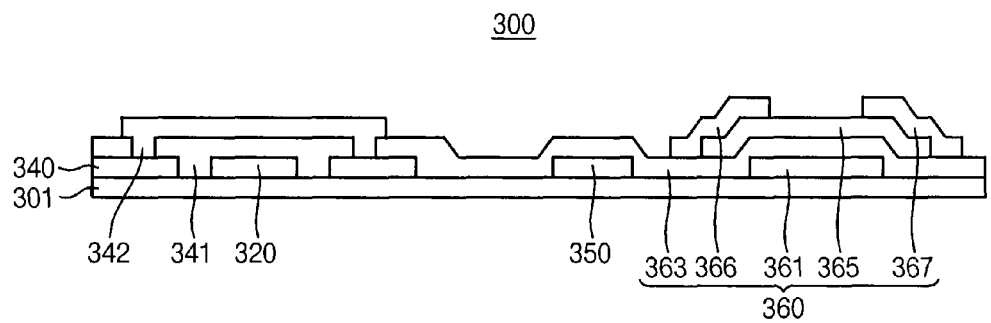
FIG. 5 is a cross-sectional view of a display substrate according to another example embodiment.

FIG. 5 is a cross-sectional view of a display substrate according to another example embodiment.

Referring to FIG. 5, the display substrate 300 may include a substrate 301, first sensing loops 320, second sensing loops 340, insulation layers 341, bridges 342, a gate line 350, and a transistor 360. Since the aforementioned elements of the display substrate 300 are similar to the corresponding elements described above, a detailed description of those similar elements shall be omitted.

The sensing loops 320 and 340 may be disposed on the substrate 301, and may be configured to detect an electromagnetic wave. In an example embodiment, the sensing loops 320 and 340 may include first sensing loops 320 and second sensing loops 340. The first sensing loops 320 may be arranged in a first direction at a predetermined interval, and one side of each of the first sensing loops 320 may be open. The second sensing loops 340 may be arranged in a second direction at a predetermined interval, and one side of each of the second sensing loops 340 may be open. Since the sensing functions and principles of the first sensing loops 320 and the second sensing loops 340 have been previously described, a description of those sensing functions and principles will not be repeated.

In an example embodiment, the first sensing loops 320 and the second sensing loops 340 may be disposed on the same layer. For example, as illustrated in FIG. 5, the first sensing loops 320 and the second sensing loops 340 may be disposed on the same layer as the gate line 350. For example, the gate line 350 connected to a gate electrode 361 of the transistor 360 may be formed on the substrate 301, and the first sensing loops 320 and the second sensing loops 340 may be formed on the substrate 301 and separated from the gate line 350.

In an example embodiment, since the first sensing loops 320 are disposed in a direction different from that of the second sensing loops 340, the first sensing loops 320 may intersect with the second sensing loops 340. In an example embodiment, since the second sensing loops 340 are electrically separated from the first sensing loops 320, each of the second sensing loops 340 may include passing regions at which the first sensing loops 320 pass through the second sensing loops 340. Each of the second sensing loops 340 may be electrically terminated at the passing regions, so as to be electrically separated from the first sensing loops 320. In another example embodiment, each of the first sensing loops 320 may include passing regions at which the second sensing loops 340 pass through the first sensing loops 320. Each of the first sensing loops 320 may be electrically terminated at the passing regions, so as to be electrically separated from the second sensing loops 340.

The insulation layer 341 may be disposed covering the first sensing loops 320 and the second sensing loops 340. In an example embodiment, the insulation layer 341 may be a gate insulation layer 363 of the transistor 360. The insulation layer 341 may be disposed on the substrate 301 covering the sensing loops 320 and 340. The insulation layer 341 may protect the first sensing loops 320 and the second sensing loops 340 from external dust. The insulation layer 341 may insulate the first sensing loops 320 from the second sensing loops 340. The insulation layer 341 may include an oxide, an organic insulating material, etc. For example, the insulation layer 341 may include silicon oxide, hafnium oxide, aluminum oxide, zirconium oxide, titanium oxide, tantalum oxide, a benzocyclobutene-based resin, an acryl-based resin, etc.

The bridges 342 may electrically connect the terminated portions of each of the sensing loops 340 to each other. For example, the bridges 342 may connect the terminated portions of each of the second sensing loops 340. The bridges 342 may intersect with the first sensing loops 320. Since the bridges 342 electrically connect the terminated portions of each of the second sensing loops 340 to each other, the second sensing loops 340 may be electrically separated from the first sensing loops 320, and intersect with the first sensing loops 320. In an example embodiment, the bridges 342 may electrically connect the terminated portions of each of the second sensing loops 340 to each other through direct contact with the terminated portions of each of the second sensing loops 340. For example, the first bridges 342 may penetrate the first insulation layer 341 and contact the terminated portions of each of the second sensing loops 340. In another example embodiment, the bridges 342 may be electrically connected to the terminated portions of each of the second sensing loops 340 via an additional contact unit or pad having a low contact resistance.

In an example embodiment, the first bridges 342 may be disposed on the same layer as a source electrode 366 and a drain electrode 367 of the transistor 360. In other words, the gate line 350 and the sensing loops 320 and 340 may be disposed on the same layer. The bridges 342, the source electrode 366, and the drain electrode 367 may be disposed on the same layer. Since the sensing loops 320 and 340 are disposed on the same layer as the transistor 360, a thickness of the display substrate 300 may be reduced.

In another example embodiment, the bridges 342 may be disposed on the same layer as a data line connected to the source electrode 366 or the drain electrode 367. Since the bridges 342 may be formed with a conductive material having a low resistance (same as that of the data line), the resistance of the second sensing loops 340 may be reduced. The bridges 342 and the data line may include a metal, a conductive metal oxide, and/or an alloy of metals that have a low resistance. For example, the bridges 342 and data line may include a low resistance metal (e.g., copper, aluminum, silver, gold, tungsten, etc).

As described above, the sensing loops 320 and 340 for detecting a position of the external electromagnetic inducing object may be formed in the display substrate 300 having an in-cell structure. In particular, the sensing loops 320 and 340 and the bridges 342 may be formed on the same layer and in the same stacking structure. The in-cell structure eliminates the need for an additional board or film for the electromagnetic induction type touch input device. Accordingly, a display panel including the display substrate 300 may have relatively slim thickness, and a manufacturing process for the display panel may be simplified. Further, since the bridges 342 may be formed with a conductive material having a low resistance (same as that of the data line), a resistance of the second transmitting loops 340 may be reduced.

Figure 6:
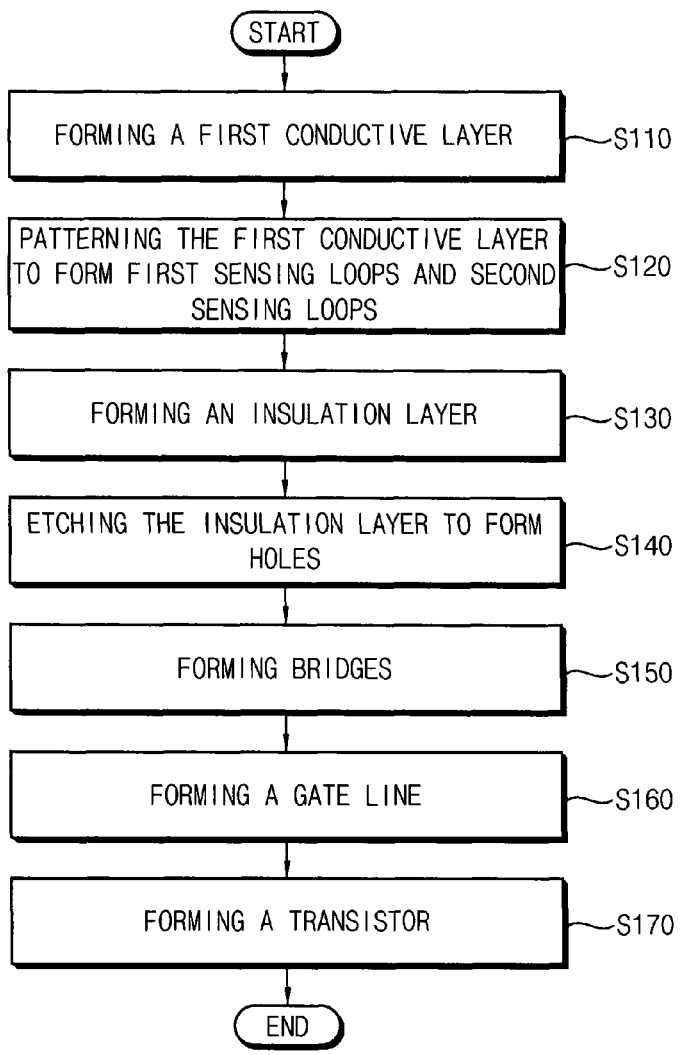
FIG. 6 is a flow chart illustrating a method of manufacturing a display substrate according to an example embodiment.

FIG. 6 is a flow chart illustrating a method of manufacturing a display substrate according to an example embodiment. FIGS. 7 through 13 are cross-sectional views of the display substrate at different stages of manufacturing according to the method of FIG. 6.

Referring to FIGS. 6 through 13, the method includes forming a first conductive layer on a substrate (S110), patterning the first conductive layer to form a plurality of first sensing loops and a plurality of second sensing loops (S120), forming an insulation layer to cover the first sensing loops and the second sensing loops (S130), etching the insulation layer to form a plurality of holes exposing portions of each of the second sensing loops (S140), forming a plurality of bridges in contact with the portions of each of the second sensing loops by filling the holes (S150), forming a gate line on the insulation layer (S160), and forming a transistor electrically connected to the gate line (S170). Since the display substrate 100 of FIGS. 1 through 3 can be manufactured using the method of FIG. 6, the method of FIG. 6 will therefore be described with reference to the display substrate 100 of FIGS. 1 through 3.

Figure 7:
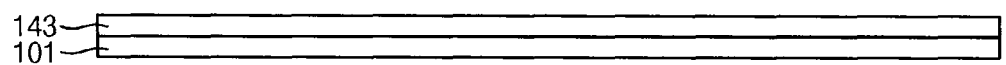
FIGS. 7 through 13 are cross-sectional views of the display substrate at different stages of manufacturing according to the method of FIG. 6.

Referring to FIG. 7, the first conductive layer 143 is formed on the substrate 101. The first conductive layer 143 may be formed of a metal (e.g., aluminum, silver, gold, platinum, chromium, tungsten, molybdenum, titanium, palladium, or an alloy thereof), a transparent conductive material (e.g., indium tin oxide, indium zinc oxide, aluminum zinc oxide, tin oxide, indium oxide, gallium oxide, etc), etc. The first conductive layer 143 may be formed as a single layered structure or multi-layered structure including one or more of the above-listed materials. The first conductive layer 143 may be formed by sputtering, chemical vapor deposition (CVD), atomic layer deposition (ALD), pulsed layer deposition (PLD), printing process, etc.

Figure 8:
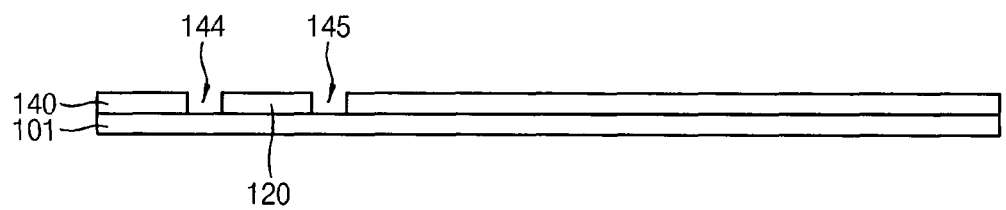

Referring to FIG. 8, the first conductive layer 143 is patterned to form the first sensing loops 120 and the second sensing loops 140. The patterning process may be performed using, for example, photolithography. In an example embodiment, the first sensing loops 120 may be arranged in a first direction by a predetermined interval, and one side of each of the first sensing loops 120 may be open. The second sensing loops 140 may be arranged in a second direction (that is different from the first direction) by a predetermined interval, and one side of each of the second sensing loops 140 may be open. The second sensing loops 140 may intersect with the first sensing loops 120. Further, the second sensing loops 140 may be electrically separated from the first sensing loops 120. Each of the second sensing loops 140 may include passing regions 144 and 145 at which the first sensing loops 120 pass through the second sensing loops 140. Thus, the second sensing loops 140 may be electrically separated at the passing regions 144 and 145.

Figure 9:
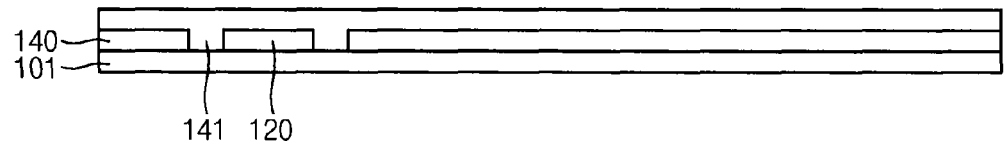

Referring to FIG. 9, the insulation layer 141 is formed covering the first sensing loops 120 and the second sensing loops 140. The insulation layer 141 may be formed of silicon oxide, hafnium oxide, aluminum oxide, zirconium oxide, titanium oxide, tantalum oxide, a benzocyclobutene-based resin, an acryl-based resin, etc. The insulation layer 141 may be formed as a single layered structure or multi-layered structure including one or more of the above-listed materials. The insulation layer 141 may be formed by chemical vapor deposition, atomic layer deposition, pulsed layer deposition, printing process, etc.

Figure 10:
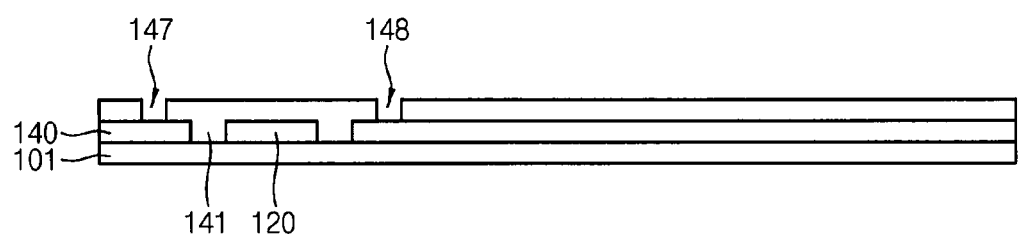

Referring to FIG. 10, the insulation layer 141 is etched to form a plurality of holes 147 and 148 exposing the second sensing loops 140. The holes 147 and 148 may be formed by photolithography.

Figure 11:
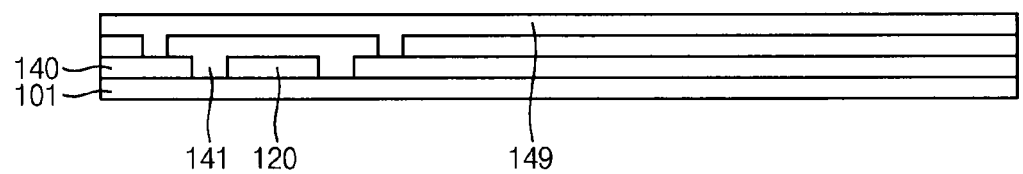

Referring to FIG. 11, a second conductive layer 149 is formed covering the holes 147 and 148. The second conductive layer 149 may be formed using the same method for forming the first conductive layer 143. For example, the second conductive layer 149 may be formed of a metal, an alloy of the metal, a transparent conductive material, etc. The second conductive layer 149 may be formed by sputtering, chemical vapor deposition, atomic layer deposition, pulsed layer deposition, printing process, etc. The second conductive layer 149 may be formed as a single layered structure or multi-layered structure including one or more of the above-listed materials.

Figure 12:
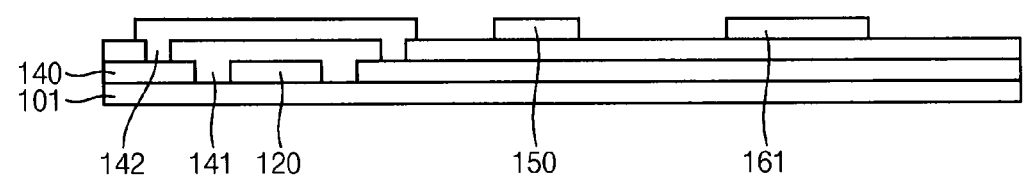

Referring to FIG. 12, the second conductive layer 149 is patterned to form bridges 142, a gate line 150, and a gate electrode 161. The patterning process may be performed by photolithography. The bridges 142 may be formed in contact with the second sensing loops 140 by filling the holes 147 and 148. The bridges 142 may intersect with the first sensing loops 120. The insulation layer 141 may be disposed between the bridges 142 and the first sensing loops 120. The second sensing loops 140 may be electrically separated from the first sensing loops 120, and intersect with the first sensing loops 120 at the bridges 142. In an example embodiment, the gate line 150 may be electrically connected to the gate electrode 161. For example, the gate electrode 161 may extend from the gate line 150.

Figure 13:
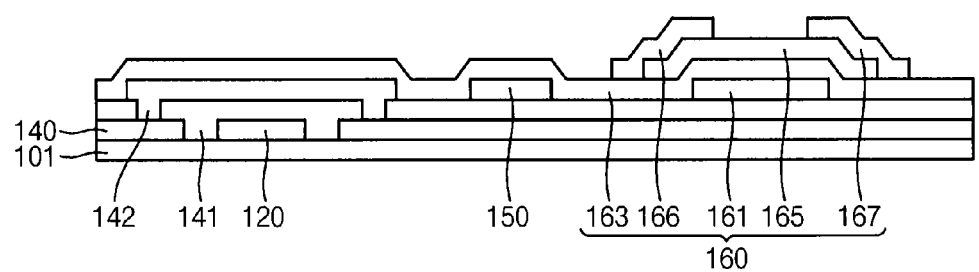

Referring to FIG. 13, the transistor 160 is formed connected to the gate line 150. The transistor 160 may be formed using processes known to those skilled in the art. For example, a gate insulation layer 163 may be formed covering the gate electrode 161, a semiconductor layer 165 may be formed on the gate insulation layer 163 overlapping the gate electrode 161, and a source electrode 166 and a drain electrode 167 may be formed in contact with the semiconductor layer 165. In an example embodiment, a data line may be formed connected to the source electrode 166 or the drain electrode 167.

As previously described, the method of FIG. 6 allows an electromagnetic induction type touch input device to be formed directly on the substrate 110 of the display panel 100 at the same time with the transistor 160, thereby achieving an in-cell structure. In particular, the method of FIG. 6 (and the in-cell structure) eliminates the need to form the electromagnetic induction type touch input device on an additional film or board. Thus, the display substrate 100 including the electromagnetic induction type touch input device having an in-cell structure may be formed by a simple manufacturing process. Further, since the display substrate 100 manufactured by the method of FIG. 6 has a slim thickness, the display device still has a slim overall thickness even if an additional touch screen panel is attached to the display substrate 100.

The present inventive concept may be applied to a display panel (e.g., an organic light emitting display panel, a liquid crystal display panel, a plasma display panel, an electrophoretic display panel, an electrowetting display panel, etc).

The foregoing is illustrative of example embodiments and is not to be construed as limiting the inventive concept. Although a few example embodiments have been described, those skilled in the art will readily appreciate that many modifications can be made to the example embodiments without materially departing from the novel teachings and advantages of the present inventive concept. Accordingly, all such modifications are intended to be included within the scope of the present inventive concept as defined in the claims.

What is claimed is:

1. A display substrate comprising:
    a substrate;
    a plurality of first sensing loops arranged on the substrate in a first direction at a predetermined interval, wherein one side of each of the first sensing loops is open;
    a plurality of second sensing loops arranged on the substrate in a second direction different from the first direction at a predetermined interval, wherein the second sensing loops are electrically separated from the first sensing loops, each of the second sensing loops including passing regions at which the first sensing loops pass through, and one side of each of the second sensing loops is open;
    an insulating layer covering the first sensing loops and the second sensing loops;
    a plurality of bridges disposed on the insulating layer, the bridges intersecting with the first sensing loops, the bridges penetrating the insulating layer and formed in contact with the second sensing loops;
    a gate line disposed on the insulating layer; and
    a transistor connected to the gate line, the transistor being disposed on the insulating layer,
    wherein the first sensing loops include first transmitting loops and first receiving loops,
    wherein the second sensing loops include second transmitting loops and second receiving loops, and
    wherein the first transmitting loops and the second transmitting loops are disposed on a first layer, and the first receiving loops and the second receiving loops are disposed on a second layer that is different from the first layer.

2. The display substrate of claim 1, wherein the bridges are disposed at the passing regions.

3. The display substrate of claim 2, wherein the gate line and the bridges are disposed on another same layer.

4. The display substrate of claim 3, wherein the bridges and the gate line include a same conductive material.

5. The display substrate of claim 1, wherein the first transmitting loops generate a transmitting electromagnetic wave based on a transmitting current, and the first receiving loops generate a receiving current based on electromagnetic wave generated from an external electromagnetic inducing object, and
    wherein the second transmitting loops generate the transmitting electromagnetic wave, and the second receiving loops receive electromagnetic wave generated from the external electromagnetic inducing object.

6. The display substrate of claim 1, wherein the insulating layer includes a first insulating layer covering the first transmitting loops and the second transmitting loops, and a second insulating layer covering the first receiving loops and the second receiving loops, and
    wherein the bridges include first bridges electrically connecting portions of each of the second transmitting loops to each other at the passing regions, and second bridges electrically connecting portions of each of the second receiving loops to each other at the passing regions.

7. The display substrate of claim 6, wherein the gate line and the first bridges are disposed on a same third layer, and wherein the gate line and the first bridges include a same conductive material.

8. A method of manufacturing a display substrate, comprising:
    forming a first conductive layer on a substrate;
    patterning the first conductive layer to form a plurality of first sensing loops and a plurality of second sensing loops, the first sensing loops comprising first transmitting loop and first receiving loops and being arranged on the substrate in a first direction at a predetermined interval, the second sensing loops comprising second transmitting loop and second receiving loops and being arranged on the substrate in a second direction different from the first direction at a predetermined interval, the second sensing loops being electrically separated from the first sensing loops, each of the second sensing loops including passing regions at which the first sensing loops pass through, one side of each of the first sensing loops and one side of each of the second sensing loops are open, the first transmitting loops and the second transmitting loops being disposed on a first layer, and the first receiving loops and the second receiving loops being disposed on a second layer that is different from the first layer;
    forming an insulating layer to cover the first sensing loops and the second sensing loops;
    etching the insulating layer to form a plurality of holes exposing portions of each of the second sensing loops;
    forming a plurality of bridges in contact with the portions of each of the second sensing loops by filling the holes;
    forming a gate line on the insulating layer; and
    forming a transistor electrically connected to the gate line.

9. The method of claim 8, wherein the bridges intersect with the first sensing loops at the passing regions.

10. The method of claim 8, wherein the bridges and the gate line are concurrently formed using a second conductive layer.

11. A display substrate comprising:
    a substrate;
    a plurality of first sensing loops arranged on the substrate in a first direction at a predetermined interval, wherein one side of each of the first sensing loops is open;
    a plurality of second sensing loops arranged on the substrate in a second direction different from the first direction at a predetermined interval, the second sensing loops being electrically separated from the first sensing loops, each of the second sensing loops including passing regions at which the first sensing loops pass through, and one side of each of the second sensing loops is open;
    a gate line disposed on a same layer as the first sensing loops and the second sensing loops;
    an insulating layer covering the first sensing loops, the second sensing loops, and the gate line;
    a plurality of bridges disposed on the insulating layer, the bridges intersecting with the first sensing loops, the bridges penetrating the insulating layer and formed in contact with the second sensing loops; and
    a transistor electrically connected to the gate line,
    wherein the first sensing loops include first transmitting loops and first receiving loops, wherein the second sensing loops include second transmitting loops and second receiving loops, and wherein the first transmitting loops and the second transmitting loops are disposed on a first layer, and the first receiving loops and the second receiving loops are disposed on a second layer that is different from the first layer.

12. The display substrate of claim 11, wherein the bridges are disposed at the passing regions.

13. The display substrate of claim 11, wherein the first and second sensing loops and the gate line include a same conductive material.

14. The display substrate of claim 11, wherein the bridges and a source or a drain electrode of the transistor are disposed on another same layer.

15. The display substrate of claim 11, wherein the bridges and a data line connected to the transistor are disposed on another same layer.

* * * * *